(12) United States Patent
Senda

(10) Patent No.: US 10,110,217 B2
(45) Date of Patent: Oct. 23, 2018

(54) LOAD DRIVING DEVICE

(71) Applicant: DENSO CORPORATION, Kariya, Aichi-pref. (JP)

(72) Inventor: Yasutaka Senda, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 15/756,122

(22) PCT Filed: Sep. 19, 2016

(86) PCT No.: PCT/JP2016/077602
§ 371 (c)(1),
(2) Date: Feb. 28, 2018

(87) PCT Pub. No.: WO2017/057079
PCT Pub. Date: Apr. 6, 2017

(65) Prior Publication Data
US 2018/0248543 A1    Aug. 30, 2018

(30) Foreign Application Priority Data
Sep. 29, 2015  (JP) .................... 2015-191244

(51) Int. Cl.
*H03B 1/00*   (2006.01)
*H03K 3/00*   (2006.01)
*H03K 17/16*  (2006.01)

(52) U.S. Cl.
CPC .................... *H03K 17/168* (2013.01)

(58) Field of Classification Search
CPC ... H03K 17/168; H03K 17/06; H01L 27/0635

USPC ................ 327/108–112, 427, 434, 437, 170; 326/82, 83, 87
See application file for complete search history.

(56) References Cited

U.S. PATENT DOCUMENTS

| | | | |
|---|---|---|---|
| 8,766,702 B2* | 7/2014 | Hussein | H03K 17/127 327/108 |
| 2007/0284664 A1 | 12/2007 | Okuda et al. | |
| 2009/0002054 A1 | 1/2009 | Tsunoda et al. | |
| 2012/0126859 A1* | 5/2012 | Kawamoto | H03K 17/163 327/108 |

(Continued)

FOREIGN PATENT DOCUMENTS

| | | |
|---|---|---|
| JP | H05-291913 A | 11/1993 |
| JP | H07-322600 A | 12/1995 |
| JP | 2000-217337 A | 8/2000 |

*Primary Examiner* — Thomas Skibinski
(74) *Attorney, Agent, or Firm* — Posz Law Group, PLC

(57) ABSTRACT

A load driving device includes: a first turn-on drive circuit turning on a first power device as one of a plurality of gate-driven power devices; a second turn-on drive circuit turning on a second power device as another one of the plurality of gate-driven power devices different from the first power device; a current detection circuit detecting a current in at least the first power device; and a control circuit controlling the first turn-on drive circuit to turn on the first power device by applying a gate voltage with a first change rate, and subsequently controlling the second turn-on drive circuit to turn on the second power device by applying a gate voltage with a second change rate, which is larger than the first change rate, based on a condition in which the current detection circuit does not detect an overcurrent in the first power device.

7 Claims, 10 Drawing Sheets

(56) References Cited

U.S. PATENT DOCUMENTS

| | | | |
|---|---|---|---|
| 2012/0242376 A1* | 9/2012 | Ose | H03K 17/0828 327/109 |
| 2012/0280728 A1 | 11/2012 | Hussein et al. | |
| 2014/0203860 A1* | 7/2014 | Senda | H03K 17/30 327/381 |
| 2015/0236686 A1* | 8/2015 | Senda | H03K 17/0828 327/381 |

* cited by examiner

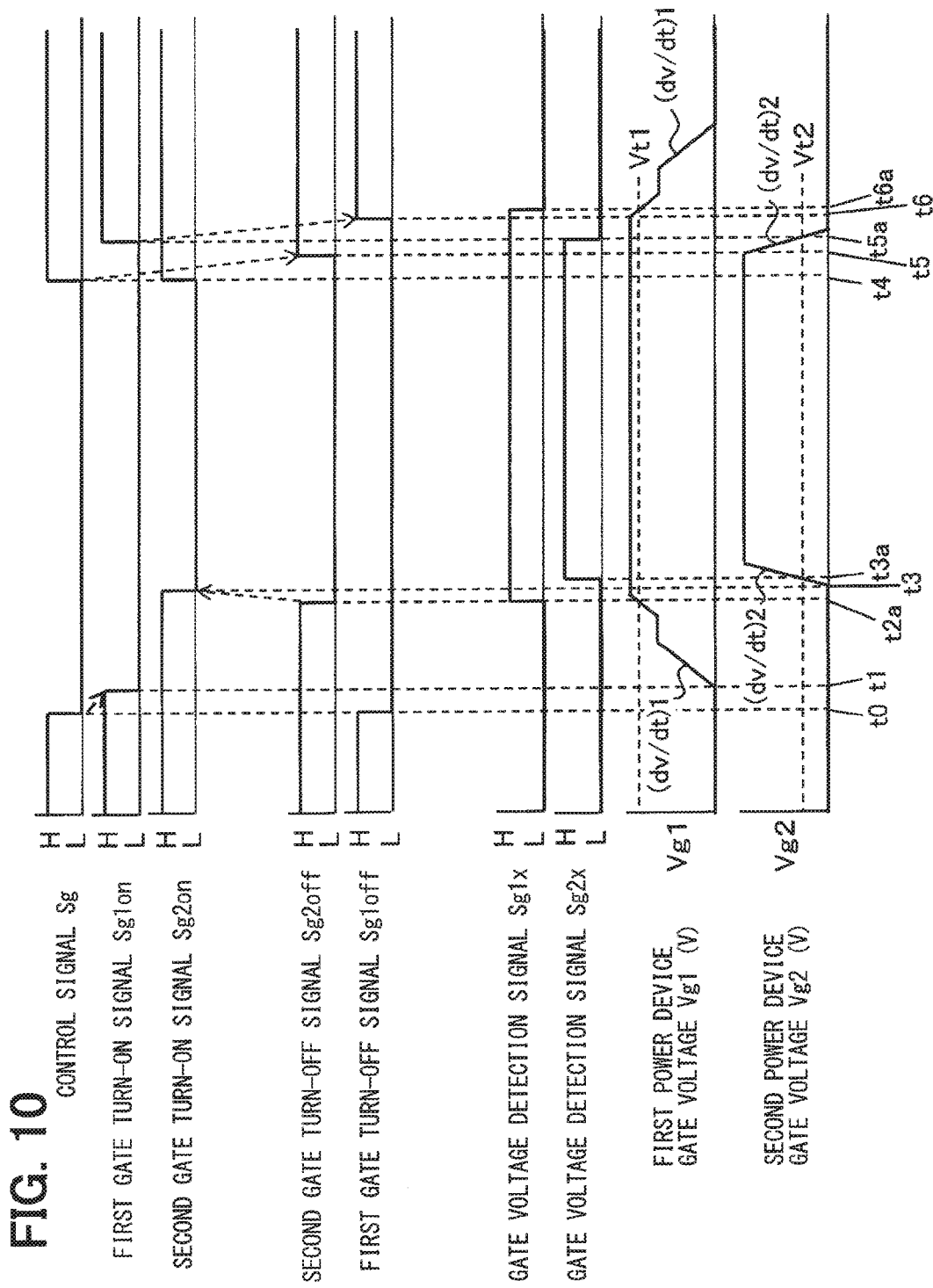

LOAD DRIVING DEVICE

CROSS REFERENCE TO RELATED APPLICATION

This application is a U.S. national stage application of International Application No. PCT/JP2016/077602 filed on Sep. 19, 2016 and is based on Japanese Patent Application No. 2015-191244 filed on Sep. 29, 2015, the disclosures of which are incorporated herein by reference.

TECHNICAL FIELD

The present disclosure relates to a load driving device.

BACKGROUND

Some load driving circuits that drive gate-driven power devices, such as gate drive circuits for driving insulated gate bipolar transistors (IGBTs), drive a plurality of power devices connected in parallel in order to allow a large current to flow. Some of such gate drive circuits adopt a configuration for driving the plurality of power devices at different timings rather than at the same time to avoid a large turn-on surge current.

In such a configuration, damage caused by overcurrent can be prevented by determining, as an abnormality, an overcurrent flowing through a power device that is turned on first and stopping the power application to the other power devices.

However, conventional devices are not designed to reduce current losses, since the turn-on current required by the power devices to be turned on later is sometimes increased.

PATENT LITERATURE

Patent Literature 1: JP 2012-249509 A

SUMMARY

An object of the present disclosure is to provide a load driving device that can minimize switching losses as much as possible when separately driving a plurality of gate-driven power devices connected in parallel in a power supply path to a load.

A load driving device according to a first aspect of the present disclosure drives a plurality of gate-driven power devices in parallel in a power supply path to a load. The device includes: a first turn-on drive circuit turning on a first power device as one of the plurality of gate-driven power devices; a second turn-on drive circuit turning on a second power device as another one of the plurality of gate-driven power devices different from the first power device; a current detection circuit detecting a current in at least the first power device; and a control circuit controlling the first turn-on drive circuit to turn on the first power device by applying a gate voltage with a first change rate, and subsequently controlling the second turn-on drive circuit to turn on the second power device by applying a gate voltage with a second change rate, which is larger than the first change rate, based on a condition in which the current detection circuit does not detect an overcurrent in the first power device.

A load driving device according to a second aspect of the present disclosure drives a plurality of gate-driven power devices arranged in parallel in a power supply path to a load. The load driving device includes: a first turn-off drive circuit configured to turn off a first power device, which is one of the plurality of gate-driven power devices; a second turn-off drive circuit configured to turn off a second power device, which is one of the plurality of gate-driven power devices other than the first power device; a detection circuit configured to detect an overcurrent at least in the first power device or the second power device; and a control circuit that is configured to, when the detection circuit detects an overcurrent in the plurality of gate-driven power devices with the first power device and the second power device turned on, or when the plurality of gate-driven power devices are turned off, control the second turn-off drive circuit to turn off the second power device by applying a gate voltage with a first change rate, and subsequently control the first turn-off drive circuit to turn off the first power device by applying a gate voltage with a second change rate, which is smaller than the first change rate.

By adopting the configuration described above, when turning on the first and second power devices, the control circuit causes the first turn-on drive circuit to turn on the first power device, and, after that, causes the second turn-on drive circuit to turn on the second power device by applying a gate voltage with a second change rate that is higher than the first change rate, on the condition that the current detection circuit does not detect an overcurrent in the first power device.

The change rate of the terminal voltage and the change rate of the output current in the first power device are determined by the change rate of the gate voltage in the first power device that is turned on first. Therefore, the first change rate ($dvg1/dt$) of the gate voltage is set based on limitations imposed by the noise, surge, and characteristics of the first power device. The second power device that is turned on later, on the other hand, is designed such that the gate is turned on after the terminal voltage has been stabilized, and therefore does not affect the switching. Accordingly, the second power device can be turned on with a reduced turn-on voltage so as to reduce turn-on losses. Since it is not necessary to take account of the requirements like those for the first power device for determining the second change rate ($dvg2/dt$) of the gate voltage, the second power device can be turned on as soon as possible from the specified turn-on time to reduce the turn-on voltage, thereby reducing the turn-on losses.

As a result, the first power device and second power device, when driven separately, can be operated with reduced noise and surge in the first power device and with reduced turn-on losses in the second power device.

BRIEF DESCRIPTION OF DRAWINGS

The above and other objects, features and advantages of the present disclosure will become more apparent from the following detailed description made with reference to the accompanying drawings. In the drawings:

FIG. 10 is a time chart of signals and voltages of various units.

DETAILED DESCRIPTION

First Embodiment

<Basic Configuration>

A first embodiment of the present disclosure will be hereinafter described with reference to FIGS. 1 to 4. This embodiment illustrates one example of a load driving device 1 applied to a configuration in which two IGBTs 2 and 3 are connected in parallel as a plurality of gate-driven power devices to drive a load. Here, the IGBT 2 and the IGBT 3 are provided as a first power device and a second power device, respectively. The IGBT 3 is higher in current capacity than the IGBT 2.

Figure 1:
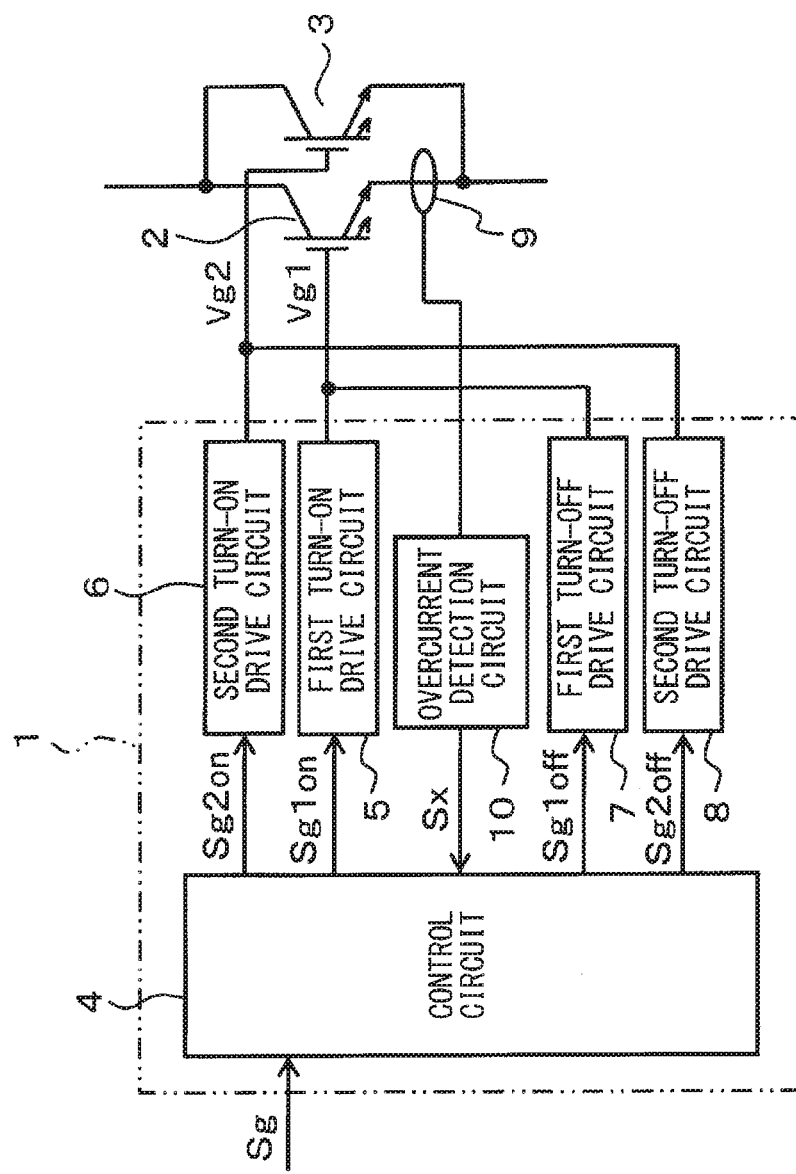
FIG. 1 is a basic electrical configuration diagram illustrating a first embodiment.

FIG. 1 illustrates the basic configuration of the first embodiment. The load driving device 1 is configured to drive the two IGBTs 2 and 3 separately. A control circuit 4 outputs drive signals to turn on and off the IGBTs 2 and 3 in response to a control signal received from the outside. The IGBTs 2 and 3 are each provided with a circuit that gives gate turn-on signals thereto and a circuit that gives gate turn-off signals thereto. A first turn-on drive circuit 5 and a second turn-on drive circuit 6 are provided for giving gate turn-on signals to the IGBTs 2 and 3, and a first turn-off drive circuit 7 and a second turn-off signal 8 are provided for giving gate turn-off signals to the IGBTs 2 and 3. An emitter current of the IGBT 2 is detected by a current detector 9, and an overcurrent detection circuit 10 determines whether the emitter current is an overcurrent, based on a signal of the detection.

In the configuration described above, when the control circuit 4 receives a control signal Sg from the outside, the control circuit 4 outputs an H-level first gate turn-on signal Sg1on to the first turn-on drive circuit 5 while outputting an L-level first gate turn-off signal Sg1off to the first turn-off drive circuit 7 so as to turn on the IGBT 2 first. The gate voltage build-up rate (dv/dt) 1 applied by the first turn-on drive circuit 5 to the gate of the IGBT 2 is set lower than the gate voltage build-up rate (dv/dt) 2 when turning on the IGBT 3 to be described later. The gate voltage build-up rate (dv/dt) 1 corresponds to a first change rate. The gate voltage Vg1 of the IGBT 2 rises at the gate voltage build-up rate (dv/dt) 1, then stays at a constant level during the Miller plateau period halfway through the rise, before rising again at the gate voltage build-up rate (dv/dt) 1 so that a predetermined gate voltage is applied. This puts the IGBT 2 into an ON state.

After the IGBT 2 has turned to the ON state and an emitter current has started flowing, when the current detected by the current detector 9 is in a normal range, the control circuit 4 outputs an H-level second gate turn-on signal Sg2on to the second turn-on drive circuit 6 while outputting an L-level second gate turn-off signal Sg2off to the second turn-off drive circuit 8, so as to turn on the IGBT 3. After the IGBT 2 has been turned on, the voltage across the collector and emitter of the IGBT 3 is equal to the turn-on voltage of the IGBT 2 and is stable. The second turn-on drive circuit 6 applies a gate voltage Vg2 to the gate of the IGBT 3 with the gate voltage build-up rate (dv/dt) 2 that is the second build-up rate. The rapid rise of the gate voltage Vg2 brings the IGBT 3 into an ON state.

In this way, switching loss is reduced in the IGBT 2 that is turned on first, by raising the gate voltage Vg1 at the first change rate. When the circuit is in the normal state where no overcurrent flows at the time point when the IGBT 2 is turned on, the gate voltage Vg2 is successively applied to the gate of the IGBT 3 with the second change rate to rapidly turn the IGBT 3 on, so that turn-on loss can be reduced. When the circuit is in an abnormal state where an overcurrent flows at the time point when the IGBT 2 is turned on first, the IGBT 3 is not turned on and the IGBT 2 is turned off to prevent the IGBTs 2 and 3 from being destroyed.

<Concrete Configuration of First Embodiment>

Figure 2:
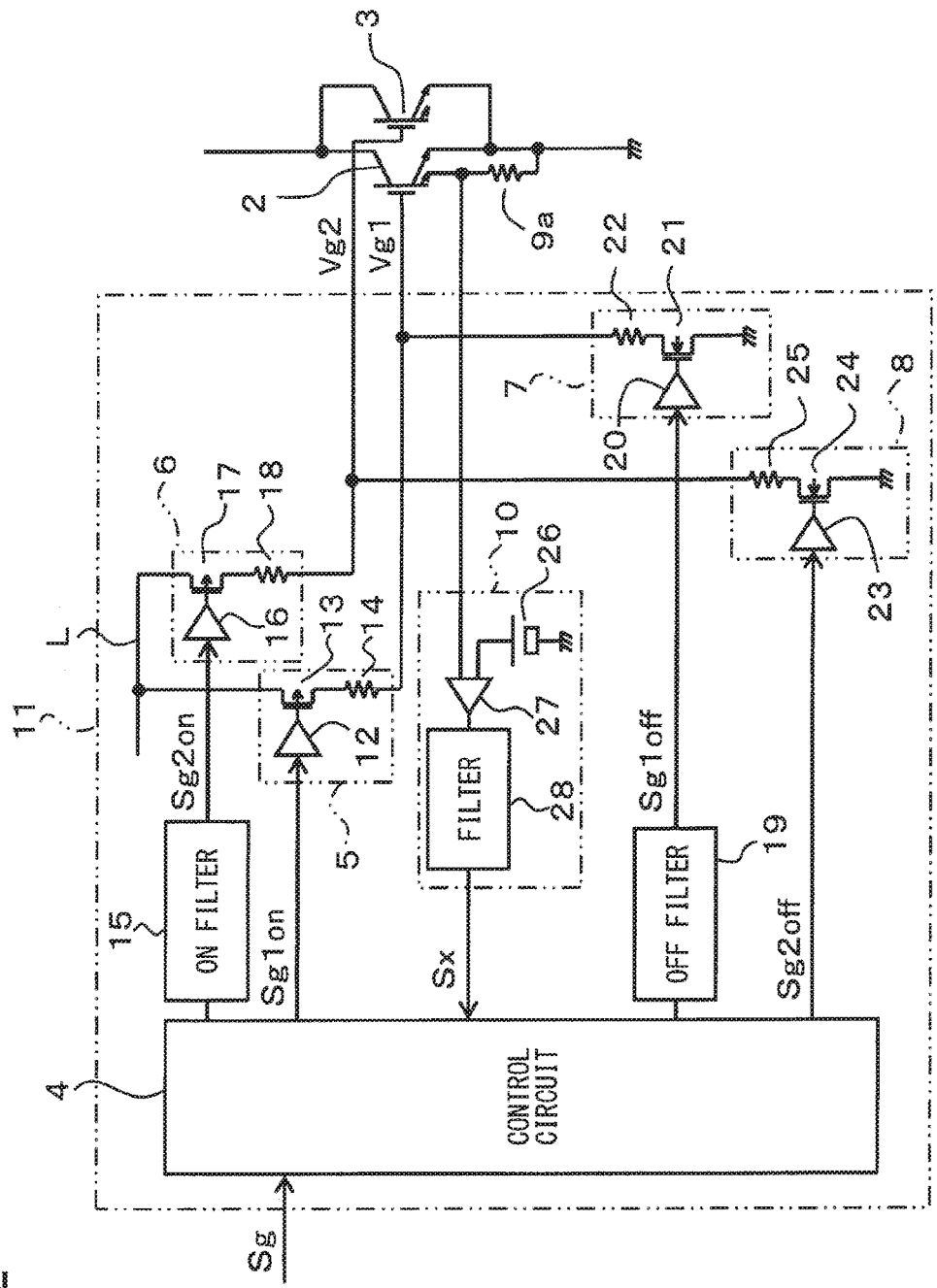
FIG. 2 is a specific electrical configuration diagram.

FIG. 2 shows one concrete example of the basic configuration of FIG. 1 as a load driving circuit 11. The first turn-on drive circuit 5 includes a buffer circuit 12, a P-channel MOSFET 13, and a resistor 14. The buffer circuit 12 receives a first gate turn-on signal Sg1on from the control circuit 4 and provides the gate of the MOSFET 13 with a drive signal. The source of the MOSFET 13 is connected to a power line L, while the drain is connected to the gate of the IGBT 2 via the resistor 14. The resistor 14 has a predetermined resistance value and adjusts the build-up rate of the gate voltage of the IGBT 2 to the first change rate when the MOSFET 13 is turned on.

The second turn-on drive circuit 6 is configured to receive a drive signal from the control circuit 4 via an ON filter 15. The ON filter 15 receives the L-level drive signal for turning on the IGBT 3 from the control circuit 4, and outputs a second gate turn-on signal Sg2on for turning on the IGBT 3 to the second turn-on drive circuit 6 when the control circuit 4 does not cancel the signal by the lapse of a predetermined ON-filtering time TFon. The ON filter 15 changes the filtering time to "0" to pass the signal when the drive signal changes to H-level to turn off the IGBT 3.

The second turn-on drive circuit 6 includes a buffer circuit 16, a P-channel MOSFET 17, and a resistor 18. The second turn-on drive circuit 6 receives a second gate turn-on signal Sg2on from the control circuit 4 via the ON filter 15 and provides the gate of the MOSFET 17 with a drive signal. The source of the MOSFET 17 is connected to the power line L, while the drain is connected to the gate of the IGBT 3 via the resistor 18. The resistor 18 has a predetermined resistance value and adjusts the build-up rate of the gate voltage of the IGBT 3 to the second change rate when the MOSFET 17 is turned on.

The first turn-off drive circuit 7 is configured to receive a drive signal from the control circuit 4 via an OFF filter 19. The OFF filter 19 receives the drive signal from the control circuit 4, and outputs a first gate turn-off signal Sg1off for turning off the IGBT 2 to the first turn-off drive circuit 7 when the control circuit 4 does not cancel the signal by the lapse of a predetermined ON-filtering time TFoff. The OFF filter 19 changes the filtering time to "0" to pass the signal when the drive signal changes to the L-level to turn on the IGBT 2.

The first turn-off drive circuit 7 includes a buffer circuit 20, an N-channel MOSFET 21, and a resistor 22. The first turn-off drive circuit 7 receives a first gate turn-off signal Sg1off from the control circuit 4 via the OFF filter 19 and provides the gate of the MOSFET 21 with a drive signal. The drain of the MOSFET 21 is connected to the gate of the IGBT 2 via the resistor 22, while the source is connected to the ground. The resistor 22 has a predetermined resistance value and adjusts the gate voltage fall rate of the IGBT 3 to the first change rate when the MOSFET 21 is turned on.

The second turn-off drive circuit 8 includes a buffer circuit 23, an N-channel MOSFET 24, and a resistor 25. The buffer circuit 23 receives a second gate turn-off signal Sg2off from the control circuit 4 and provides the gate of the MOSFET 24 with a drive signal. The drain of the MOSFET 24 is connected to the gate of the IGBT 3 via the resistor 25, while the source is connected to the ground. The resistor 25 has a predetermined resistance value and adjusts the gate voltage fall rate of the IGBT 3 to the second change rate when the MOSFET 24 is turned on.

The IGBT 2 includes a current detection terminal, and a current detection resistor 9a is connected in series as the current detector 9. The overcurrent detection circuit 10 includes a reference power supply 26, a comparator 27, and a filter 28. A terminal voltage of the current detection resistor 9a is input to the comparator 27 to be compared with a voltage set by the reference power supply 26 for determination. The voltage set by the reference power supply 26 is set to a voltage for determining an overcurrent. When an H-level determination signal is input from the comparator 27, the filter 28 outputs an overcurrent detection signal Sx to the control circuit 4 based on continuation of the signal for a certain period of time.

Figure 3:
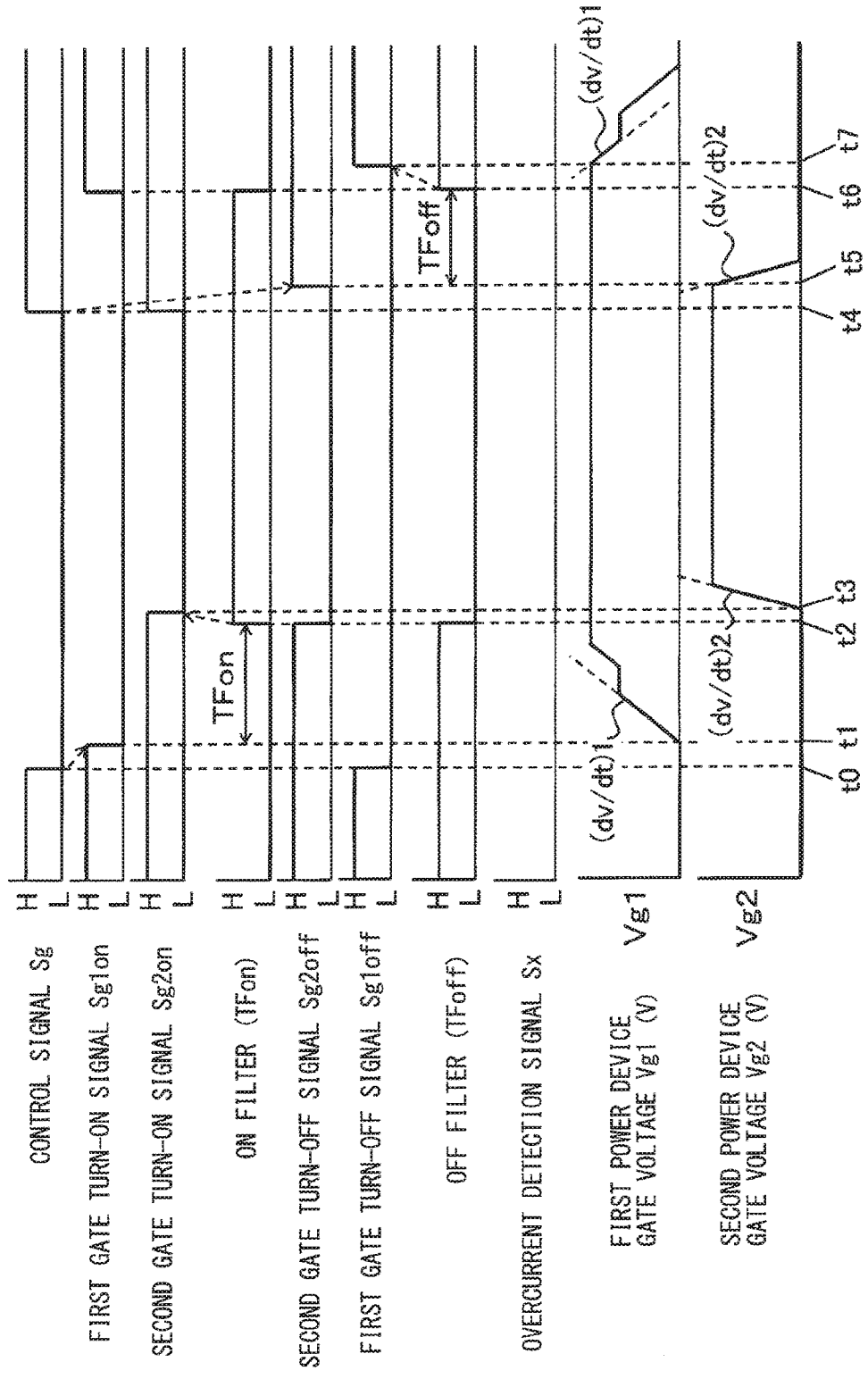
FIG. 3 is a time chart of signals and voltages of various units.

Next, the effects of the configuration described above will be described with reference to FIG. 3. The turn-on operation will be described first. It is assumed herein that a control signal Sg that changes from an H level to an L level is input from the outside to the control circuit 4 at time t0 to turn on the IGBTs 2 and 3 as shown in FIG. 3. The control circuit 4 provides the first turn-off drive circuit 7 with the L-level first gate turn-off signal Sg1off as shown in FIG. 3. At this time, the OFF filter 19 does not act, and the MOSFET 21 of the first turn-off drive circuit 7 is turned off. The IGBT 2 changes to a floating state from the state in which the gate is connected to the ground via the resistor 22 and the MOSFET 21.

Next, the control circuit 4 outputs the L-level first gate turn-on signal Sg1on to the first turn-on drive circuit 5 at time t1 as shown in FIG. 3 after a short period of time to ensure that the MOSFET 21 is turned off. At the same time, the control circuit 4 outputs a drive signal to the ON filter 15 for turning on the IGBT 3. The ON filter 15 keeps and does not output the drive signal to the second turn-on drive circuit 6 from time t1 until time t2 when a predetermined time TFon has passed, as shown in FIG. 3. During this period, the control circuit 4 is waiting for an input of overcurrent detection signal Sx from the overcurrent detection circuit 10.

Meanwhile, the MOSFET 13 of the first turn-on drive circuit 5 is turned on by the first gate turn-on signal Sg1on given at time t1, so that a gate voltage is applied to the gate of the IGBT 2 via the resistor 12 from the power line L. The gate voltage Vg1 of the IGBT 2 rises at an increase rate (dv/dt) 1 that is the first change rate, as shown in FIG. 3. The gate voltage stays at a constant level during the Miller plateau period halfway through the rise, after which the gate voltage Vg1 of the IGBT 2 rises again at the increase rate (dv/dt) 1 until it reaches a constant level. This turns on the IGBT 2, and a current flows across the collector and the emitter. The voltage across the collector and emitter of the IGBT 2 at this time is lowered to the turn-on voltage, so that the voltage across the collector and emitter of the IGBT 3 connected in parallel is also lowered to the turn-on voltage.

In this way, the current that flows when the IGBT 2 is turned on is detected by the current detection resistor 9a, and when it is at a normal level, the overcurrent detection circuit 10 does not output the overcurrent detection signal Sx. After that, when the output of the ON filter 15 changes from an L level to an H level at time t2 as mentioned above, the control circuit 4 outputs the L-level second gate turn-off signal Sg2off to the second turn-off drive circuit 8 as shown in FIG. 3.

This brings the MOSFET 24 into an OFF state, so that the gate terminal of the IGBT 3 goes into a floating state. After that, at time t3, the ON filter 15 outputs the L-level second gate turn-on signal Sg2on to the second turn-on drive circuit 6. This turns on the MOSFET 17 in the second turn-on drive circuit 5 so that a gate voltage is applied to the IGBT 3 via the resistor 18 from the power line L.

The gate voltage Vg2 of the IGBT 3 rises at an increase rate (dv/dt) 2 that is the second change rate, as shown in FIG. 3. The increase rate (dv/dt) 2 is set higher than the increase rate (dv/dt) 1, so that the gate voltage Vg2 of the IGBT 3 increases rapidly to reach an ON state and a current flows across the collector and the emitter. Consequently, a current flows through both of the IGBTs 2 and 3 and thus a large current is ready to be supplied.

The turn-off operation will be described next. A control signal Sg that changes from an L level to an H level is input from the outside to the control circuit 4 at time t4 for turning off the IGBTs 2 and 3 as shown in FIG. 3. The control circuit 4 provides the second turn-on drive circuit 6 with the H-level second gate turn-on signal Sg2on as shown in FIG. 3. At this time, the ON filter 15 does not act, and the MOSFET 17 of the second turn-on drive circuit 6 is turned off. The IGBT 3 changes to a floating state from the state in which the gate is connected to the power line L via the resistor 18 and the MOSFET 17.

Next, the control circuit 4 outputs the H-level second gate turn-off signal Sg2off to the second turn-off drive circuit 8 at time t5 as shown in FIG. 3 after a short period of time to ensure that the MOSFET 17 is turned off. At the same time, the control circuit 4 outputs a drive signal for turning off the IGBT 2 to the OFF filter 19. The OFF filter 19 keeps and does not output the drive signal to the first turn-off drive circuit 7 from time t5 until time t6 when a predetermined time TFoff has passed, as shown in FIG. 3.

Meanwhile, the MOSFET 25 of the second turn-off drive circuit 8 is turned on by the second gate turn-off signal Sg2off given at time t5, so that the gate of the IGBT 3 is connected to the ground via the resistor 25, so that the gate of the IGBT 3 is discharged. Therefore, the gate voltage Vg2 of the IGBT 3 decreases at a fall rate (dv/dt) 2 that is the second change rate, as shown in FIG. 3. This brings the IGBT 3 into an OFF state.

After that, when the output of the OFF filter 19 changes from an L level to an H level at time t6 as mentioned above, the control circuit 4 outputs the H-level first gate turn-on signal Sg1on to the first turn-on drive circuit 5 as shown in FIG. 3.

This brings the MOSFET 13 into an OFF state, so that the gate terminal of the IGBT 2 goes into a floating state. After that, at time t7, the OFF filter 19 outputs the H-level first gate turn-off signal Sg1off to the first turn-off drive circuit 7 as shown in FIG. 3. This turns on the MOSFET 21 in the first turn-off drive circuit 7 so that the gate of the IGBT 2 is connected to the ground via the resistor 22.

The gate voltage Vg1 of the IGBT 2 decreases at a fall rate (dv/dt) 1 that is the first change rate, as shown in FIG. 3. The gate voltage stays at a constant level during the Miller plateau period halfway through the fall, after which the gate voltage Vg1 of the IGBT 2 falls again at the decrease rate (dv/dt) 1 until it reaches the ground level. The decrease rate (dv/dt) 1 is set lower than the decrease rate (dv/dt) 2, so that the gate voltage Vg1 of the IGBT 2 decreases slowly.

Figure 4:
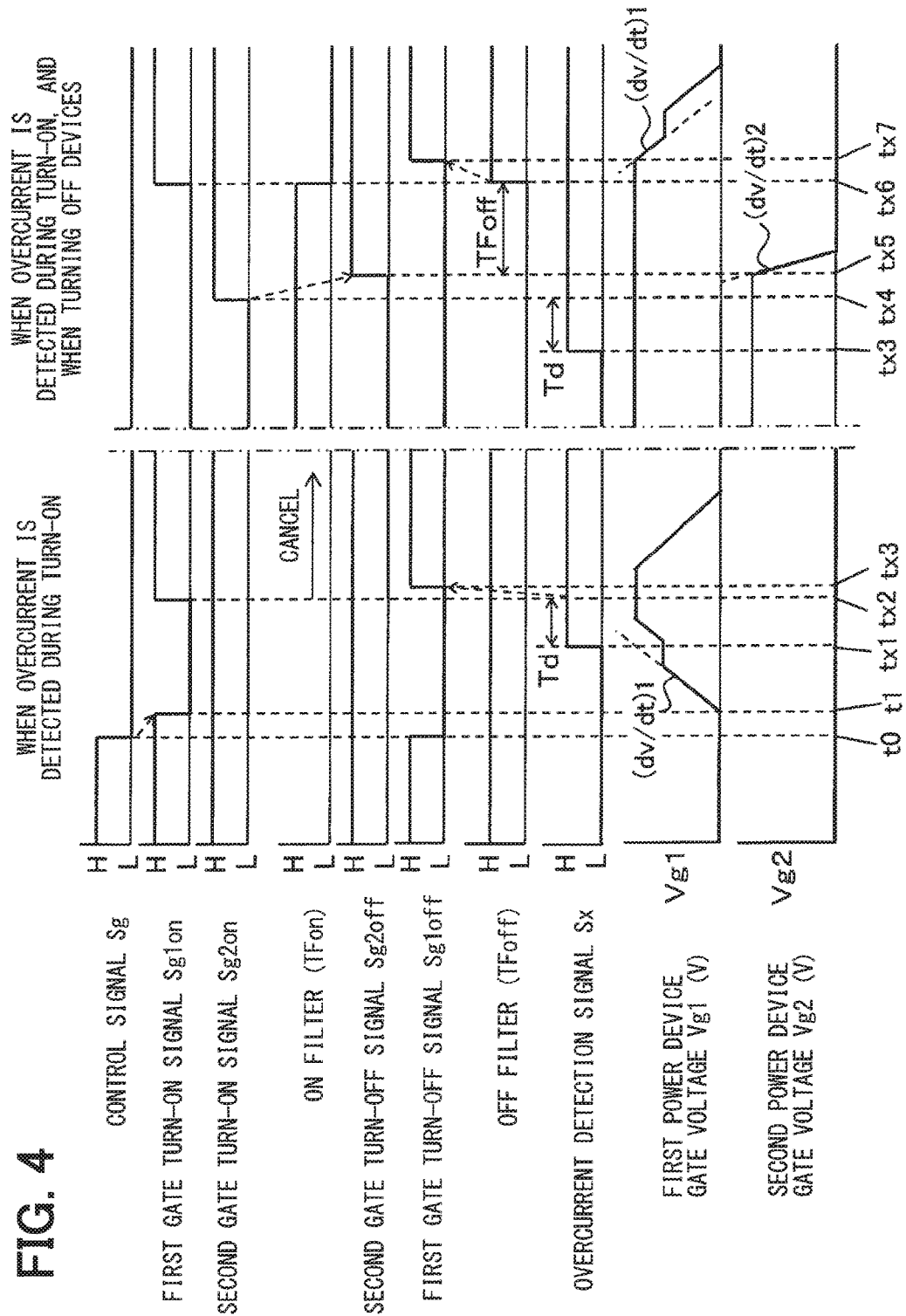
FIG. 4 is a time chart of signals and voltages of various units when an overcurrent is detected.

Next, the operation when an overcurrent flows due to a failure of the IGBT 2 when the IGBT 2 is turned on will be described with reference to FIG. 4. Similarly to the operation described above, when a control signal Sg is input from the outside at time t0, the control circuit 4 turns on the IGBT 2 at time t1 as shown in FIG. 4, after bringing the gate of the IGBT 2 into a floating state. An overcurrent starts to flow across the collector and the emitter as the voltage is applied to the gate of the IGBT 2 and rises. This overcurrent raises the terminal voltage of the current detection resistor 9a, and when the overcurrent detection circuit 10 determines that the terminal voltage has exceeded the voltage of the reference power supply 26, the comparator 27 outputs the H-level overcurrent detection signal Sx as shown in FIG. 4. The overcurrent detection signal Sx is output by the filter 28 to the control circuit 4 at time tx2 when a certain time Td has passed.

Consequently, the control circuit 4 cancels the operation of the ON filter 15 at time tx2, and outputs the H-level first gate turn-on signal Sg1on to the first turn-on drive circuit 5. This turns off the MOSFET 13 of the first turn-on drive circuit 5, so that the gate of the IGBT 2 goes into a floating state.

After that, the H-level first gate turn-off signal Sg1off is output to the first turn-off drive circuit 7 at time tx3 to ensure that the MOSFET 13 is turned off. This turns on the MOSFET 21 in the first turn-off drive circuit 7 so that the gate of the IGBT 2 is connected to the ground via the resistor 22.

In this way, when an overcurrent is detected at the time of turning on the IGBT 2 first, the control circuit 4 cancels the operation of turning on the IGBT 3 and turns off the IGBT 2, so that destruction of the IGBTs 2 and 3 by the overcurrent can be prevented.

Next, the operation when an overcurrent flows through the IGBT 2, with the IGBTs 2 and 3 turned on, will be described. This is the case where the control circuit 4 detects an overcurrent after time t3, when the IGBTs 2 and 3 are both in the ON state. As shown in FIG. 4, when the overcurrent detection signal Sx is output by the comparator 27 of the overcurrent detection circuit 10 at time tx3, the overcurrent detection signal Sx is output to the control circuit 4 via the filter 28 at time tx4 after the filtering time Td has passed.

Starting from time tx4 when the overcurrent detection signal Sx is input from the filter 28 as the time point for starting the turn-off control, the control circuit 4 turns off the IGBT 3 first and then turns off the IGBT 2 similarly to the turn-off control performed from t4 to t7 in FIG. 3 as described above.

Namely, when the overcurrent detection signal Sx is input instead of the control signal Sg at time tx4, the control circuit 4 provides the second turn-on drive circuit 6 with the H-level second gate turn-on signal Sg2on, as shown in FIG. 4. This turns off the MOSFET 17, so that the gate of the IGBT 3 goes into a floating state.

Next, the control circuit 4 outputs the H-level second gate turn-off signal Sg2off to the second turn-off drive circuit 8 at time tx5 to output a drive signal to the OFF filter 19 for turning off the IGBT 2. The output signal of the OFF filter 19 changes to an H level at time tx6 when a predetermined time TFoff has passed. The OFF filter 19 outputs the H-level first gate turn-off signal Sg1off to the first turn-off drive circuit 7 at time tx7 after a little time has passed from time tx6.

Meanwhile, the MOSFET 25 of the second turn-off drive circuit 8 is turned on by the second gate turn-off signal Sg2off given at time tx5, so that the gate of the IGBT 3 is discharged. Therefore, the gate voltage Vg2 of the IGBT 3 decreases at the fall rate (dv/dt) 2 until the IGBT 3 turns to the OFF state.

After that, when the output of the OFF filter 19 changes to an H level at time tx6 as mentioned above, the control circuit 4 outputs the H-level first gate turn-on signal Sg1on to the first turn-on drive circuit 5, thereby bring the gate terminal of the IGBT 2 into a floating state. At time tx7, the OFF filter 19 outputs the H-level first gate turn-off signal Sg1off to the first turn-off drive circuit 7. Thus, the gate of the IGBT 2 is connected to the ground. The gate voltage Vg1 of the IGBT 2 falls at the fall rate (dv/dt) 1, stays at a constant level during the Miller plateau period, and falls again at the decrease rate (dv/dt) 1 until it reaches the ground level. Thus, the IGBTs 2 and 3 are both turned off.

According to the present embodiment, the IGBT 2 is turned on first, and overcurrent detection is carried out before turning on the IGBT 3, because the IGBT 3 is higher in current capacity than the IGBT 2. Similarly, the IGBT 3 is turned off first, before turning off the IGBT 2. In this way, appropriate protection against overcurrent and short-circuiting can be provided during the ON time of the IGBTs 2 and 3. Moreover, when an overcurrent is detected during the turn-on drive of the IGBT 2, the IGBT 2 can be turned off without causing a large surge to flow.

When the control signal Sg is given, the control circuit 4 applies a voltage to the gate of the IGBT 2 with a lower build-up rate of the gate voltage Vg1 to turn on the IGBT 2 first, after which the ON filter 15 applies a voltage to the IGBT 3 with a higher build-up rate of the gate voltage Vg2 to turn on the IGBT 3 rapidly. When driving parallel-connected power devices such as IGBTs 2 and 3, generally, there are influences of the characteristics and switching conditions of the power devices. In this embodiment, the IGBT 3 that is the power device with a higher current capacity is turned off first, so that the tail current can be reduced, and the switching off losses can be reduced.

The IGBT 2 that is turned on first has a predetermined build-up rate dv/dt of a collector voltage and a predetermined build-up rate di/dt of a collector current, and the build-up rate (dv/dt) 1 of the gate voltage is determined by the limitations imposed by the noise, surge, and IGBT characteristics. On the other hand, the IGBT 3 that is turned on later is designed such that the gate is turned on after the collector voltage has stabilized and therefore does not affect the switching, and is turned on such as to reduce the turn-on voltage to reduce the turn-on losses. In setting the build-up rate (dv/dt) 2 of the gate voltage of the IGBT 3, the predetermined requirements mentioned above need not be taken into consideration. Therefore, to reduce the turn-on voltage, it should be turned on as soon as possible from the specified turn-on time.

Based on these design requirements, the above effects can be achieved by setting the build-up rate (dv/dt) 1 of the gate voltage Vg1 of the IGBT 2 that is turned on first lower than the build-up rate (dv/dt) 2 of the gate voltage Vg2 of the IGBT 3 that is turned on later.

Similarly, the IGBT 2 that is turned off later has a predetermined fall rate dv/dt of a collector voltage and a predetermined fall rate di/dt of a collector current, and the fall rate (dv/dt) 1 of the gate voltage is determined by the limitations imposed by the noise, surge, and IGBT characteristics. On the other hand, the IGBT 3 that is turned off first is designed such that the gate is turned off when the collector voltage is stable and therefore does not affect the switching, and is turned off such as to reduce the tail current to reduce the turn-off losses. The predetermined requirements mentioned above need not be taken into consideration in setting the gate voltage fall rate (dv/dt) 2 of the IGBT 3. To reduce the tail current, it should be turned off as soon as possible from the specified turn-off time.

Based on these design requirements, the above effects can be achieved by setting the fall rate (dv/dt) 1 of the gate voltage Vg1 of the IGBT 2 that is turned off later lower than the fall rate (dv/dt) 2 of the gate voltage Vg2 of the IGBT 3 that is turned off first. In this way, when turning off parallel-connected IGBTs 2 and 3 separately, turn-off losses during the time in which the IGBT 2 that is turned off later is turned off can be reduced.

An overcurrent detection feature is provided only in the IGBT 2 that is turned on first to determine an abnormality, so that a cost reduction is achieved, while the safety operation design is guaranteed. This is because, normally, an abnormality detection circuit would be required in both of the IGBTs 2 and 3 since it is not known, due to device variations, in which device a largest current would flow, in a configuration wherein parallel-connected IGBTs 2 and 3 are turned on simultaneously.

Second Embodiment

Figure 5:
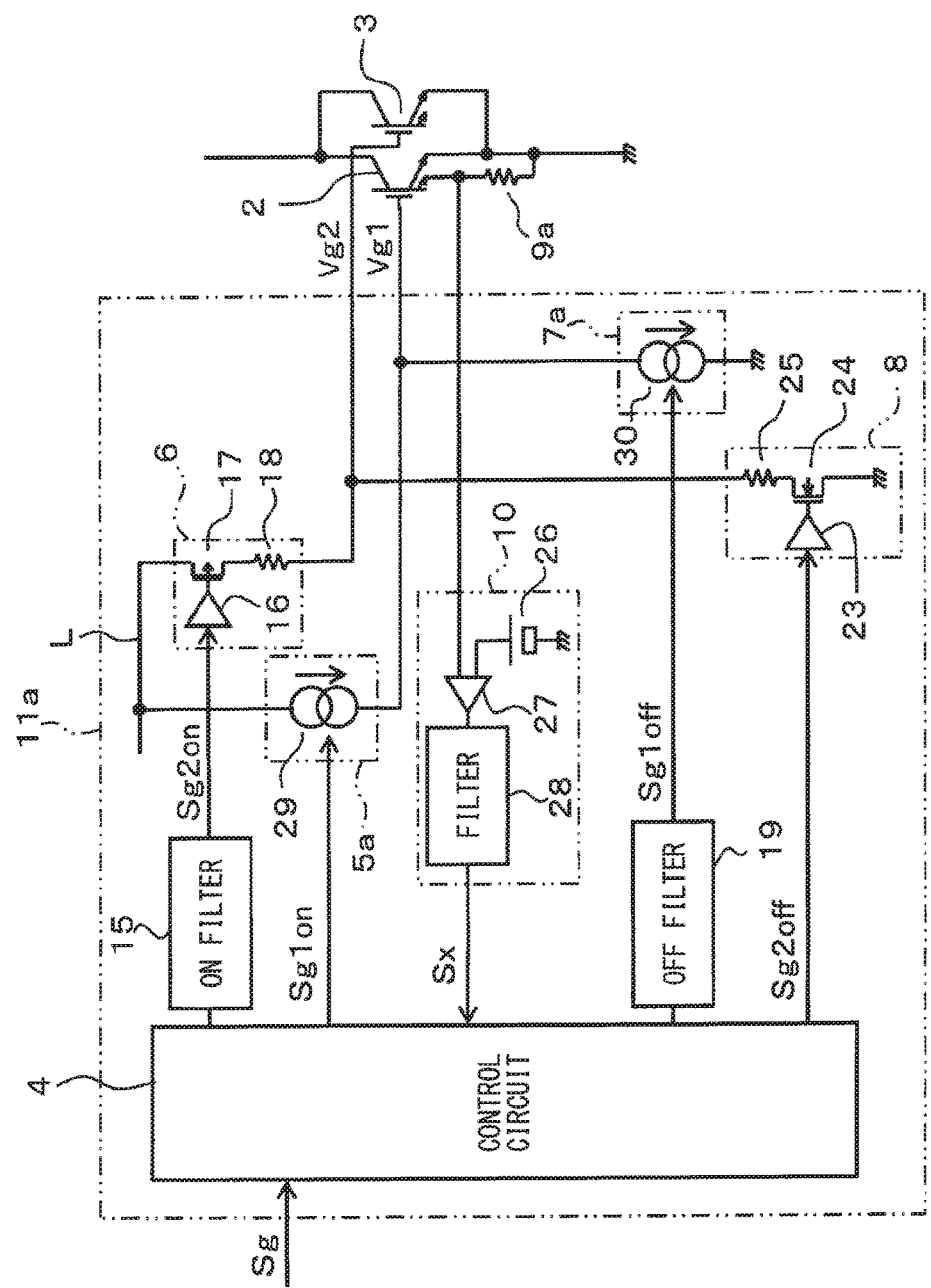
FIG. 5 is an electrical configuration diagram illustrating a second embodiment.

FIG. 5 illustrates a second embodiment, which will be described below as to parts different from those in the first embodiment. In this embodiment, the load driving circuit 11a includes a first turn-on drive circuit 5a instead of the first turn-on drive circuit 5, and a second turn-off drive circuit 7a instead of the first turn-off drive circuit 7.

The first turn-on drive circuit 5a is provided with a constant current circuit 29 that supplies a constant current to the gate of the IGBT 2 when the first turn-on drive circuit 5a receives the first gate turn-on signal Sg1on. The first turn-off drive circuit 7a is provided with a constant current circuit 30 that discharges the gate of the IGBT 2 with a constant current when the first turn-off drive circuit 7a receives the first gate turn-off signal Sg1off.

According to this configuration, when driving the IGBTs 2 and 3 with this configuration, the constant current circuit 29 that forms the first turn-on drive circuit 5a applies the gate voltage Vg1 to the gate of the IGBT 2 that is turned on first to achieve a constant current. The constant current circuit 30 that forms the first turn-off drive circuit 7 lowers the gate voltage Vg1 of the gate of the IGBT 2 that is turned off later to achieve a constant current. In this way, switching losses and noise can be reduced.

The second turn-on drive circuit 6 applies the gate voltage Vg2 to the gate of the IGBT 3 that is turned on later to achieve a constant voltage. The second turn-off drive circuit 8 lowers the gate voltage Vg2 of the gate of the IGBT 3 that is turned off first to achieve a constant voltage. In this case, the IGBT 3 is turned on and off with the voltage across the collector and the emitter being stable, so that it can be driven with a constant voltage that gives priority to the switching speed, without having to consider the influences of switching losses and noise. In this way, the second turn-on drive circuit 6 and the second turn-off drive circuit 8 can be configured with more simply-designed, inexpensive constant voltage circuits. Moreover, the device can operate at higher speed with the constant voltage drive than constant current drive circuits because there is only a delay in turning on the gate-driven switching elements.

Third Embodiment

Figure 6:
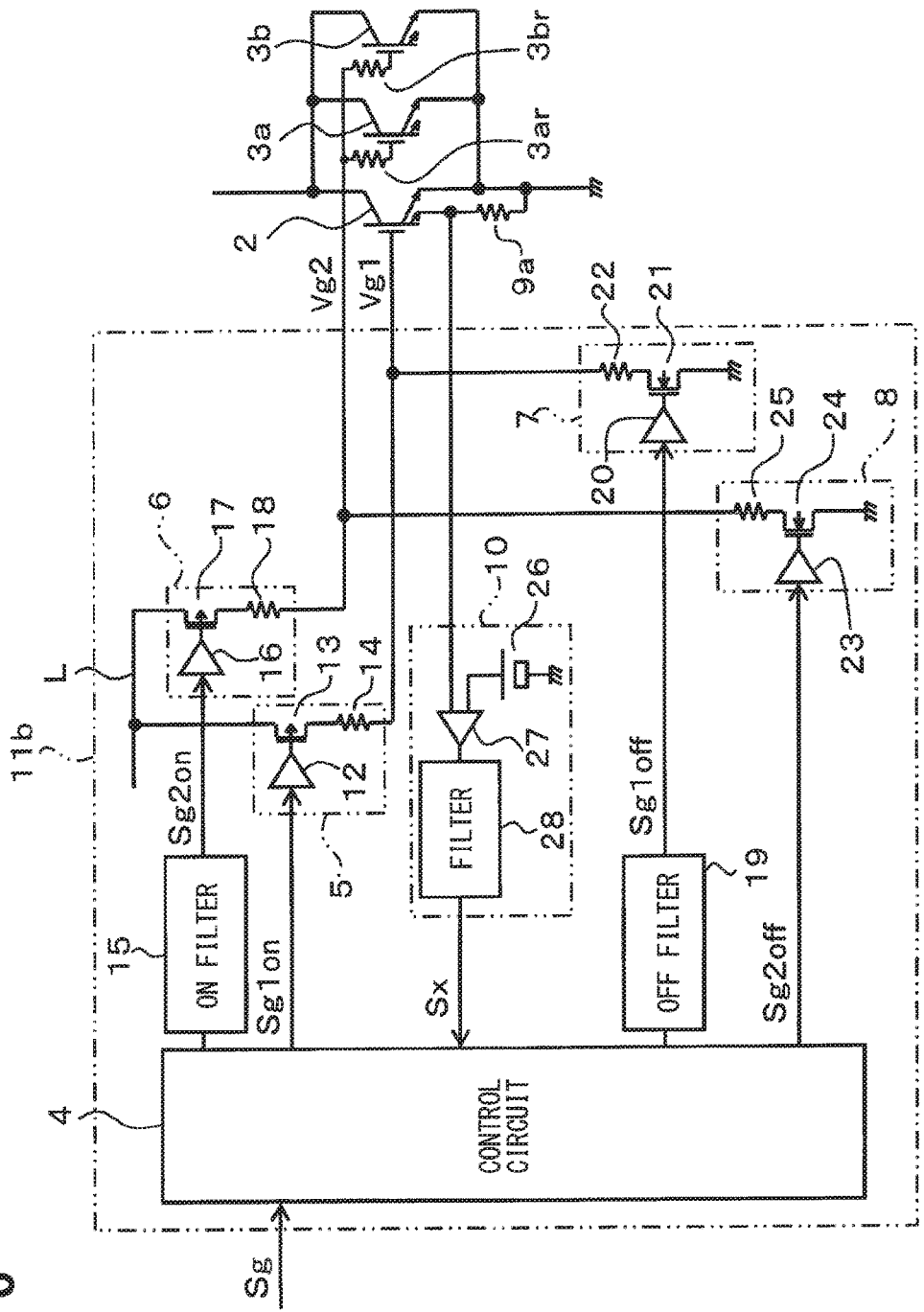
FIG. 6 is an electrical configuration diagram illustrating a third embodiment.

FIG. 6 illustrates a third embodiment, which will be described below as to parts different from those in the first embodiment. This embodiment uses three IGBTs as the switching elements each of which is an object of drive control. An IGBT 2 is provided as the first power device, while IGBTs 3a and 3b are provided as the second power devices. The load driving circuit 11b is configured to turn on and off the IGBTs 3a and 3b simultaneously by the second turn-on drive circuit 6 and the second turn-off drive circuit 8. Input resistors 3ar and 3br are provided at the gates of the IGBTs 3a and 3b, respectively, for adjusting the balance of the gate currents.

Thus, substantially the same effects as those of the first embodiment can be achieved by the third embodiment.

Fourth Embodiment

Figure 7:
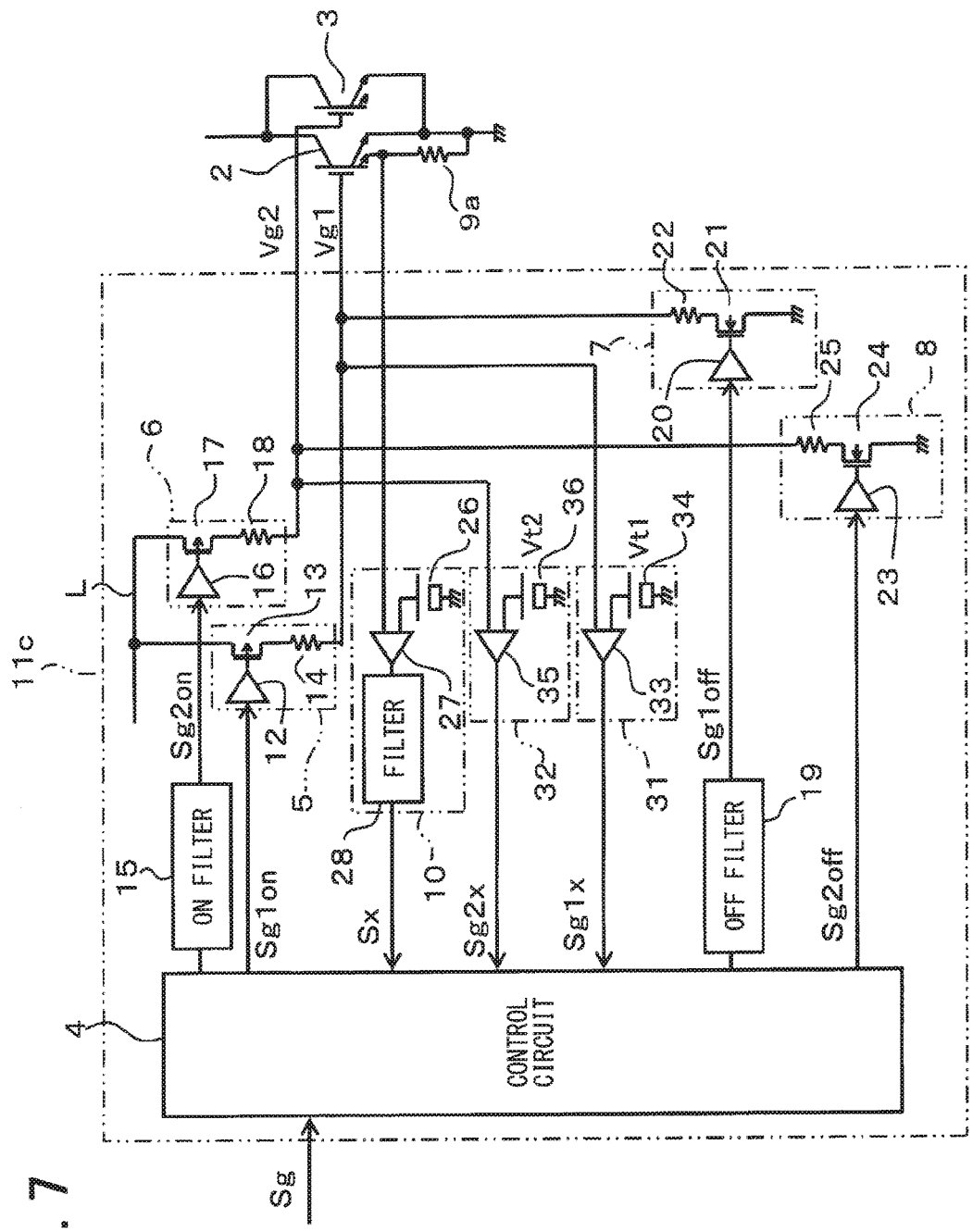
FIG. 7 is an electrical configuration diagram illustrating a fourth embodiment.
Figure 8:
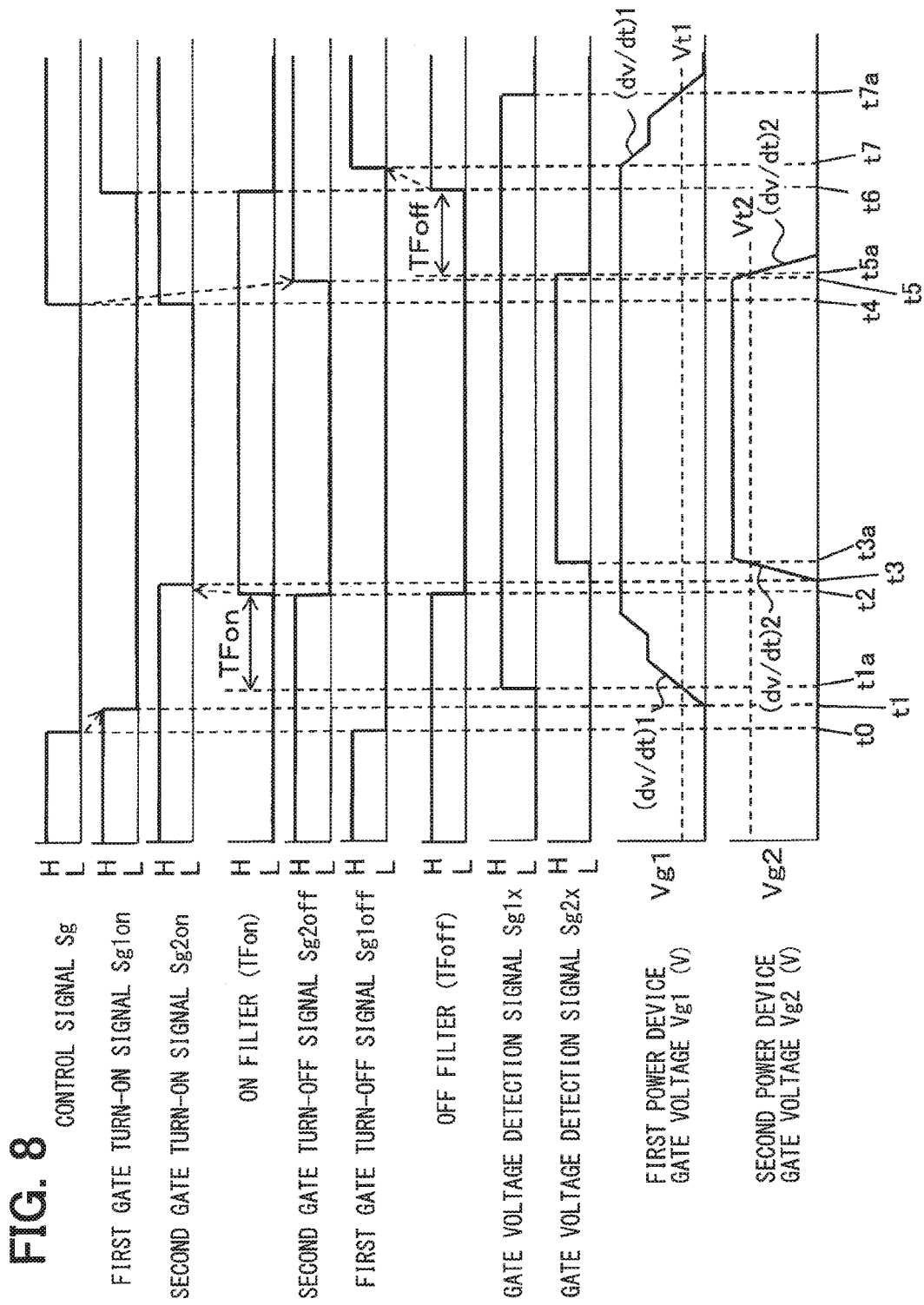
FIG. 8 is a time chart of signals and voltages of various units.

FIGS. 7 and 8 illustrate a fourth embodiment, which will be described below as to parts different from those in the first embodiment. In this embodiment, the load driving circuit 11c includes a first gate voltage detection circuit 31 that detects the gate voltage Vg1 of the IGBT 2, and a second gate voltage detection circuit 32 that detects the gate voltage Vg2 of the IGBT 3.

The first gate voltage detection circuit 31 is made up of a comparator 33 and a reference power supply 34. The gate of the IGBT 2 is connected to one input terminal of the comparator 33 for inputting the gate voltage Vg1. The reference power supply 34 is connected to the other input terminal of the comparator 33 for inputting a threshold voltage Vt1. The threshold voltage Vt1 is set to a threshold level for detecting a threshold voltage of the IGBT 2.

The second gate voltage detection circuit 32 is made up of a comparator 35 and a reference power supply 36. The gate of the IGBT 3 is connected to one input terminal of the comparator 35 for inputting the gate voltage Vg2. The reference power supply 36 is connected to the other input terminal of the comparator 35 for inputting a threshold voltage Vt2. The threshold voltage Vt2 is set to a threshold level for detecting voltages that are higher than the Miller plateau voltage of the IGBT 3 and lower than the power supply voltage.

In this embodiment where the first gate voltage detection circuit 31 and the second gate voltage detection circuit 32 are provided, the operations of the ON filter 15 and the OFF filter 19 are started from the point when the gate voltages Vg1 and Vg2 of the IGBTs 2 and 3 have reached their respective threshold voltages Vt1 and Vt2.

Next, the effects of the configuration described above will be described with reference to FIG. 8. The detection operation by the overcurrent detection circuit 10 and the operation of turning off the IGBTs 2 and 3 will not be described below, since they are carried out similarly to the first embodiment.

The turn-on operation will be described first. When the control signal Sg is input from the outside at time t0 as shown in FIG. 8, the control circuit 4 provides the first turn-off drive circuit 7 with the L-level first gate turn-off signal Sg1off, as shown in FIG. 8. At this time, the OFF filter 19 does not act, and the MOSFET 21 is turned off, so that the IGBT 2 goes into a floating state.

Next, the control circuit 4 outputs the L-level first gate turn-on signal Sg1on to the first turn-on drive circuit 5 at time t1 as shown in FIG. 8. This turns on the MOSFET 13 in the first turn-on drive circuit 5 so that a gate voltage is applied to the gate of the IGBT 2 via the resistor 12 from the power line L. The gate voltage Vg1 of the IGBT 2 rises at the increase rate (dv/dt) 1 that is the first change rate, as shown in FIG. 8.

When, as shown in FIG. 8, the gate voltage Vg1 of the IGBT 2 rises and reaches the threshold voltage Vt1 at time t1a, the first gate voltage detection circuit 31 detects the threshold voltage Vt1, and outputs an H-level gate voltage detection signal Sgx1 as shown in FIG. 8. In response to this, the control circuit 4 provides the ON filter 15 with the drive signal for turning on the IGBT 3.

The ON filter 15 keeps and does not output the drive signal to the second turn-on drive circuit 6 from time t1a until time t2 when a predetermined time TFon has passed, as shown in FIG. 8. The gate voltage Vg1 of the IGBT 2 rises further until time t2, then stays at a constant level during the Miller plateau period halfway through the rise, after which the gate voltage Vg1 of the IGBT 2 rises again until it reaches a constant level.

This turns on the IGBT 2, and a current flows across the collector and the emitter. The voltage across the collector and emitter of the IGBT 2 at this time is lowered to the turn-on voltage, so that the voltage across the collector and emitter of the IGBT 3 connected in parallel is also lowered to the low turn-on voltage level.

After that, when the overcurrent detection signal Sx is not input until time t2 when the filtering time TFon of the ON filter 15 has passed, the output signal of the ON filter 15 changes to H level as shown in FIG. 8. The control circuit 4 outputs the L-level second gate turn-off signal Sg2off to the second turn-off drive circuit 8 as shown in FIG. 8 to bring the gate of the IGBT 3 into a floating state.

After that, the control circuit 4 outputs the L-level second gate turn-on signal Sg2on to the second turn-on drive circuit 6 at time t3 after a little time has passed from time t2 as shown in FIG. 8. Thus, the gate voltage Vg2 is applied to the IGBT 3.

The gate voltage Vg2 of the IGBT 3 rises at the increase rate (dv/dt) 2 that is the second change rate, as shown in FIG. 8. The gate voltage Vg2 of the IGBT 3 increases rapidly to bring the IGBT 3 into the ON state, and current starts to flow across the collector and the emitter. During the rise of the gate voltage Vg2 of the IGBT 3, as shown in FIG. 8, the gate voltage Vg2 of the IGBT 3 reaches the threshold voltage Vt2. The second gate voltage detection circuit 32 detects this as shown in FIG. 8 and outputs an H-level gate voltage detection signal Sgx2. Based on this, the control circuit 4 can determine that the gate voltage Vg2 of the IGBT 3 has risen normally and the IGBT 3 has changed into the ON state. Consequently, current flows through both of the IGBTs 2 and 3 and thus a large current is ready to be supplied.

The turn-off operation will be described next. A control signal Sg that changes from an L level to an H level is input from the outside to the control circuit 4 for turning off the IGBTs 2 and 3 at time t4 as shown in FIG. 8. The control circuit 4 provides the second turn-on drive circuit 6 with the H-level second gate turn-on signal Sg2on as shown in FIG. 8. At this time, the ON filter 15 does not act, and the MOSFET 17 of the second turn-on drive circuit 6 is turned off, so that the IGBT 3 goes into a floating state.

Next, the control circuit 4 outputs the H-level second gate turn-off signal Sg2off to the second turn-off drive circuit 8 at time t5 as shown in FIG. 8 after a short period of time to ensure that the MOSFET 17 is turned off. This turns on the MOSFET 25 in the second turn-off drive circuit 8 so that the gate of the IGBT 3 is connected to the ground via the resistor 25 to discharge the gate. The gate voltage Vg2 of the IGBT 3 decreases at the fall rate (dv/dt) 2 that is the second change rate, as shown in FIG. 8.

As soon as the gate voltage Vg2 of the IGBT 3 starts falling, the gate voltage Vg2 of the IGBT 3 reaches the threshold voltage Vt2 at time t5a. The second gate voltage detection circuit 32 detects this as shown in FIG. 8 and outputs an H-level gate voltage detection signal Sgx2. In response to this, the control circuit 4 provides the OFF filter 19 with the drive signal for turning off the IGBT 2.

The OFF filter 19 keeps and does not output the drive signal to the first turn-off drive circuit 7 from time t5a until time t6 when a predetermined time TFoff has passed, as shown in FIG. 8. The gate voltage Vg2 of the IGBT 3 falls further to reach zero until time t6. This brings the IGBT 3 into an OFF state.

After that, when the output of the OFF filter 19 changes from an L level to an H level at time t6 as mentioned above, the control circuit 4 outputs the H-level first gate turn-on signal Sg1on to the first turn-on drive circuit 5 as shown in FIG. 8.

This brings the MOSFET 13 into an OFF state, so that the gate terminal of the IGBT 2 goes into a floating state. After that, at time t7, the OFF filter 19 outputs the H-level first gate turn-off signal Sg1off to the first turn-off drive circuit 7. This turns on the MOSFET 21 in the first turn-off drive circuit 7 so that the gate of the IGBT 2 is connected to the ground via the resistor 22.

The gate voltage Vg1 of the IGBT 2 decreases at the fall rate (dv/dt) 1 that is the first change rate, as shown in FIG. 8. The gate voltage Vg1 of the IGBT 2 stays at a constant level during the Miller plateau period halfway through the fall, after which the gate voltage Vg1 of the IGBT 2 falls again at the decrease rate (dv/dt) 1 until it reaches the ground level.

When the gate voltage Vg1 of the IGBT 2 comes close to zero, the first gate voltage detection circuit 31 detects this at time t7a when the gate voltage Vg1 of the IGBT 2 reaches the threshold voltage Vt1 as shown in FIG. 8, and outputs the H-level gate voltage detection signal Sgx1. Based on this, the control circuit 4 can determine that the gate voltage Vg1 of the IGBT 2 has fallen and the IGBT 2 has changed into the OFF state. Thus the IGBTs 2 and 3 are both turned to the OFF state.

According to the fourth embodiment, the first gate voltage detection circuit 31 is provided to activate the ON filter 15 at the time point when the gate voltage Vg1 of the IGBT 2 has reached the first threshold voltage Vt1. The second gate voltage detection circuit 32 is provided to activate the OFF filter 19 at the time point when the gate voltage Vg2 of the IGBT 3 has reached the second threshold voltage Vt2. This obviates the necessity to consider delay variations in the operation of drive circuits. The time for accommodating variations can be eliminated to reduce the filtering time, whereby losses can be reduced.

The embodiment described above is provided with the first gate voltage detection circuit 31 for setting the timing of driving the ON filter 15, and the second gate voltage detection circuit 32 for setting the timing of driving the OFF filter 19. Instead, only one of the first and second gate voltage detection circuits 31 and 32 may be provided.

When this embodiment is to be applied to the second embodiment, the configuration provided with the first gate voltage detection circuit 31 would work particularly effectively because the second embodiment employs a first turn-on drive circuit 5a that drives the IGBT 2 with a constant current, and the turn-on delay of the IGBT 2 in such a circuitry tends to be long.

Fifth Embodiment

Figure 9:
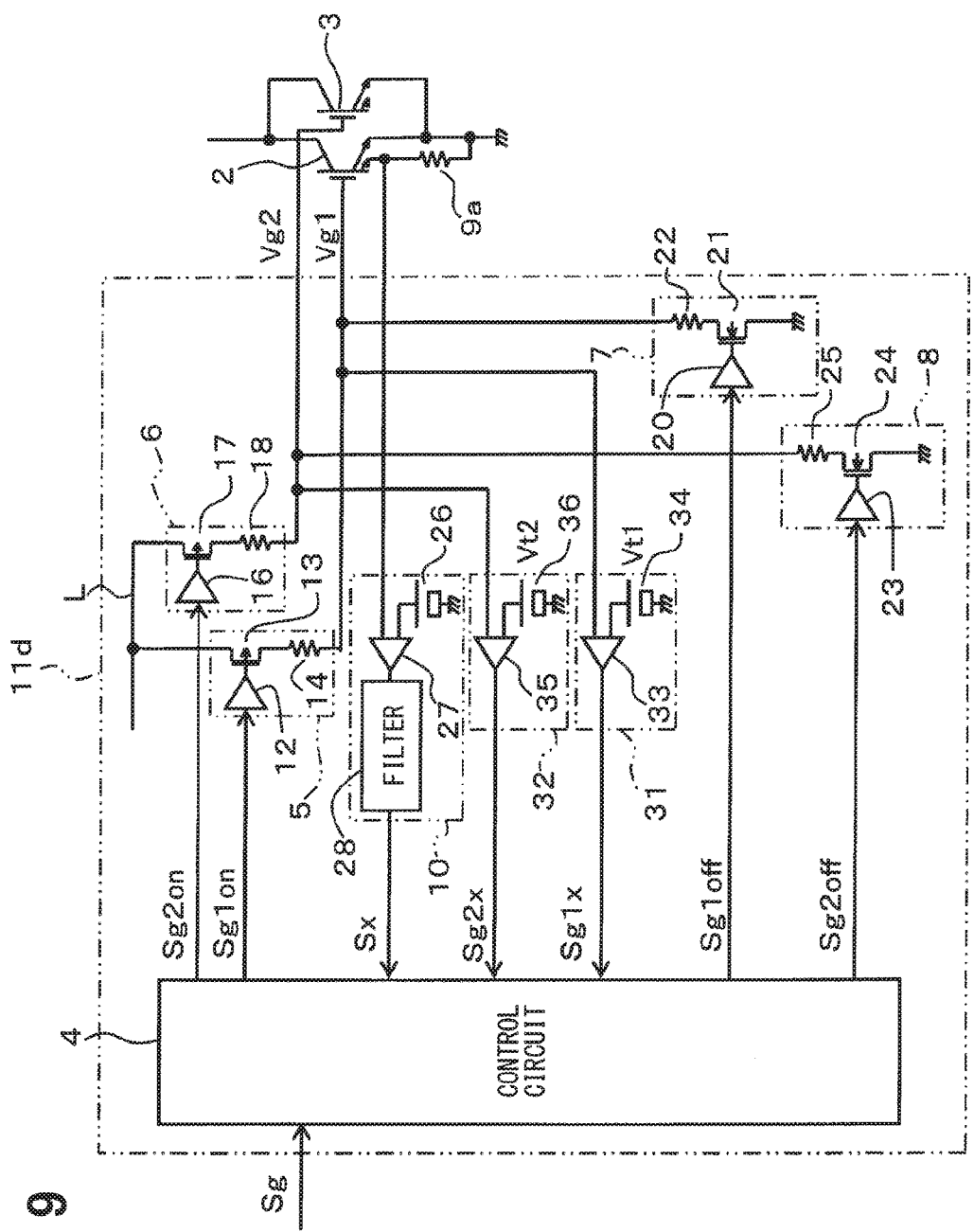
FIG. 9 is an electrical configuration diagram illustrating a fifth embodiment.

FIGS. 9 and 10 illustrate a fifth embodiment, which will be described below as to parts different from those in the fourth embodiment. The load driving circuit 11d of this embodiment does not include the ON filter 15 and OFF filter 19 of the configuration of the fourth embodiment, as shown in FIG. 9.

Therefore, to make up for the function of the ON filter 15, the threshold voltage Vt1 of the first gate voltage detection circuit 31 is set to the gate voltage during the turn-on of the IGBT 2 after the Miller plateau period. In this way, the turn-on timing of the IGBT 3 can be set appropriately utilizing the time it takes for the gate voltage Vg1 to rise during the turn-on of the IGBT 2.

To make up for the function of the OFF filter 19, the threshold voltage Vt2 of the second gate voltage detection circuit 32 is set to a lower gate voltage. In this way, the turn-off timing of the IGBT 2 can be set appropriately utilizing the time it takes for the gate voltage Vg2 to fall during the turn-off of the IGBT 3.

More specifically, as shown in FIG. 10, the control circuit 4 outputs the L-level first gate turn-on signal Sg1on to the first turn-on drive circuit 5 at time t1 as shown in FIG. 10. Thus a gate voltage is applied to the gate of the IGBT 2, so that the gate voltage Vg1 rises at the increase rate (dv/dt) 1 that is the first change rate, as shown in FIG. 10.

When the gate voltage Vg1 of the IGBT 2 rises and reaches the threshold voltage Vt1 at time t2a after the Miller plateau period, the first gate voltage detection circuit 31 detects this, and outputs the H-level gate voltage detection signal Sgx1 as shown in FIG. 10. The control circuit 4 outputs the L-level second gate turn-off signal Sg2off to the second turn-off drive circuit 8 as shown in FIG. 10 to bring the gate of the IGBT 3 into a floating state.

After that, the control circuit 4 outputs the L-level second gate turn-on signal Sg2on to the second turn-on drive circuit 6 at time t3 after a little time has passed from time t2a as shown in FIG. 10. Thus the gate voltage Vg2 is applied to the IGBT 3.

The gate voltage Vg2 of the IGBT 3 rises at the increase rate (dv/dt) 2 that is the second change rate, as shown in FIG. 10. The gate voltage Vg2 of the IGBT 3 increases rapidly to bring the IGBT 3 into the ON state, and current starts to flow across the collector and the emitter. During the rise of the gate voltage Vg2 of the IGBT 3, as shown in FIG. 10, the gate voltage Vg2 of the IGBT 3 reaches the threshold voltage Vt2. The second gate voltage detection circuit 32 detects this as shown in FIG. 10 and outputs the H-level gate voltage detection signal Sgx2.

The turn-off operation will be described next. The control circuit 4 provides the second turn-on drive circuit 6 with the H-level second gate turn-on signal Sg2on as shown in FIG. 10 to turn off the MOSFET 17, to bring the IGBT 3 into a floating state.

Next, the control circuit 4 outputs the H-level second gate turn-off signal Sg2off to the second turn-off drive circuit 8 at time t5 as shown in FIG. 10 after a short period of time to ensure that the MOSFET 17 is turned off. Therefore the gate voltage Vg2 of the IGBT 3 decreases at the fall rate (dv/dt) 2 that is the second change rate, as shown in FIG. 10.

The falling gate voltage Vg2 of the IGBT 3 reaches the threshold voltage Vt2 at time t5a when the gate voltage Vg2 of the IGBT 3 has come close to zero. The second gate voltage detection circuit 32 detects this as shown in FIG. 10 and outputs the H-level gate voltage detection signal Sgx2. In response to this, the control circuit 4 outputs the H-level first gate turn-on signal Sg1on to the first turn-on drive circuit 5 as shown in FIG. 10 to bring the gate terminal of the IGBT 2 into a floating state. After that, at time t6, the control circuit 4 outputs the H-level first gate turn-off signal Sg1off to the first turn-off drive circuit 7. Thus the gate of the IGBT 2 is connected to the ground via the resistor 22.

The gate voltage Vg1 of the IGBT 2 falls at the fall rate (dv/dt) 1 that is the first change rate as shown in FIG. 10, stays at a constant level during the Miller plateau period, and falls again at the decrease rate (dv/dt) 1 until it reaches the ground level. Immediately after the gate voltage Vg1 of the IGBT 2 has started falling, when the gate voltage Vg1 of the IGBT 2 reaches the threshold voltage Vt1 at time t6a as shown in FIG. 10, the first gate voltage detection circuit 31 detects this, and outputs the H-level gate voltage detection signal Sgx1. Based on this, the control circuit 4 can determine that the gate voltage Vg1 of the IGBT 2 has fallen and the IGBT 2 has changed into the OFF state. Thus the IGBTs 2 and 3 are both turned to the OFF state.

Therefore, the same effects as those of the fourth embodiment can be achieved with this fifth embodiment. Moreover, the ON filter 15 and the OFF filter 19 can be omitted by changing the settings of the threshold voltages Vt1 and Vt2 of the gate voltage detection circuits 31 and 32.

Other Embodiments

The present disclosure is not limited to the embodiments described above and can be applied to various embodiments without departing from the scope of the subject matter, including, for example, the following modifications or extensions.

While the embodiments described above include configurations where turn-on and turn-off are both controlled, other configurations where only turn-on is controlled, or only turn-off is controlled, are possible.

While constant current circuits 29 and 30 are provided in the first turn-on drive circuit 5 and first turn-off drive circuit 7 for the IGBT 2 that is turned on first and turned off later in the second embodiment, constant current circuits can be used also in the second turn-on drive circuit 6 and second turn-off drive circuit 8 of the IGBT 3.

The first change rate of the gate voltage applied to the first power device and the second change rate of the gate voltage applied to the second power device are set equally for both turn-on and turn-off operations in the embodiments above, but they may be set differently for the turn-on and turn-off operations, as long as the second change rate is higher than the first change rate in any instance.

While one example has been shown wherein one IGBT 2 is provided as the first power device, a plurality of first power devices may be provided and driven simultaneously. Similarly, while one example has been shown wherein one IGBT 3 or two IGBTs 3a and 3b are provided as the second power devices, three or more second power devices may be provided and driven simultaneously.

While examples have been shown where IGBTs are used as gate-driven power devices, the invention is applicable to other power devices that include gates, such as MOSFETs.

While the current detection circuit is provided for detecting the current in the IGBT 2 that is the first power device in the configurations described above, it is also possible to provide a current detection circuit for detecting the current in the IGBT 3 that is the second power device, or to provide a current detection circuit in each of them.

When a current detection feature is to be provided to both of the power device turned on first and the power device turned on later, and when there are a plurality of power devices turned on later, it is effective to provide a current detection feature only in the power device with the highest capacity. When there are a plurality of power devices turned on later, by providing an abnormality detection circuit only in the power device with the highest capacity, a cost reduction is achieved, while the safety operation design is guaranteed.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A load driving device configured to drive a plurality of gate-driven power devices arranged in parallel in a power supply path to a load, the load driving device comprising:
   a first turn-on drive circuit configured to turn on a first power device, which is one of the plurality of gate-driven power devices;
   a second turn-on drive circuit configured to turn on a second power device, which is another one of the plurality of gate-driven power devices and is different from the first power device;
   a current detection circuit configured to detect a current in at least the first power device; and
   a control circuit that is configured to
      control the first turn-on drive circuit to turn on the first power device by applying a gate voltage with a first change rate, and subsequently
      control the second turn-on drive circuit to turn on the second power device by applying a gate voltage with a second change rate, which is larger than the first change rate, based on a condition in which the current detection circuit does not detect an overcurrent in the first power device.

2. The load driving device according to claim 1,
   wherein the first turn-on drive circuit is configured to apply a gate voltage with a constant current to the first power device, and
   wherein the second turn-on drive circuit is configured to apply a gate voltage with a constant voltage to the second power device.

3. The load driving device according to claim 1,
   wherein the current detection circuit is configured to detect a current in the first power device.

4. The load driving device according to claim 1,
   wherein a current capacity of the first power device is lower than a current capacity of the second power device.

5. The load driving device according to claim 1,
   wherein the first change rate is a build-up rate, and
   wherein the second change rate is a build-up rate.

6. A load driving device configured to drive a plurality of gate-driven power devices arranged in parallel in a power supply path to a load, the load driving device comprising:
   a first turn-off drive circuit configured to turn off a first power device, which is one of the plurality of gate-driven power devices;
   a second turn-off drive circuit configured to turn off a second power device, which is one of the plurality of gate-driven power devices other than the first power device;
   a detection circuit configured to detect an overcurrent at least in the first power device or the second power device; and
   a control circuit that is configured to, when the detection circuit detects an overcurrent in the plurality of gate-driven power devices with the first power device and the second power device turned on, or when the plurality of gate-driven power devices are turned off,
      control the second turn-off drive circuit to turn off the second power device by applying a gate voltage with a first change rate, and subsequently
      control the first turn-off drive circuit to turn off the first power device by applying a gate voltage with a second change rate, which is smaller than the first change rate,
   wherein the first turn-off drive circuit is configured to apply a gate voltage with a constant current to the first power device, and
   wherein the second turn-off drive circuit is configured to apply a gate voltage with a constant voltage to the second power device.

7. The load driving device according to claim 6,
   wherein the first change rate is a falling rate, and
   wherein the second change rate is a falling rate.

* * * * *